United States Patent
So

(10) Patent No.: US 6,261,918 B1
(45) Date of Patent: Jul. 17, 2001

(54) METHOD FOR CREATING AND PRESERVING ALIGNMENT MARKS FOR ALIGNING MASK LAYERS IN INTEGRATED CIRCUIT MANUFACTURE

(75) Inventor: Daniel M. So, Escondido, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/411,807

(22) Filed: Oct. 4, 1999

(51) Int. Cl.[7] .................................................. H01L 21/76
(52) U.S. Cl. ..................... 438/401; 438/462; 438/598; 438/599; 438/671
(58) Field of Search ..................... 438/401, 462, 438/598, 599, 671, 113, 114

(56) References Cited

U.S. PATENT DOCUMENTS

| | | | |
|---|---|---|---|
| 4,981,529 | * 1/1991 | Tsujita | 148/33 |
| 5,382,545 | 1/1995 | Hong . | |
| 5,407,763 | * 4/1995 | Pai | 430/5 |
| 5,596,230 | 1/1997 | Hong . | |
| 5,686,761 | 11/1997 | Huang et al. . | |
| 5,705,080 | 1/1998 | Leung et al. . | |
| 5,733,711 | * 3/1998 | Juengling | 430/5 |
| 5,858,588 | 1/1999 | Chang et al. . | |
| 5,882,980 | * 3/1999 | Bae | 438/401 |
| 5,904,563 | 5/1999 | Yu . | |
| 5,923,996 | * 7/1999 | Shih et al. | 438/462 |
| 5,926,720 | 7/1999 | Zhao et al. . | |
| 5,943,587 | * 8/1999 | Batterson et al. | 438/401 |
| 6,060,787 | * 5/2000 | Zhao et al. | 438/401 |
| 6,100,158 | * 8/2000 | Lee et al. | 438/401 |
| 6,143,622 | * 11/2000 | Yamamoto et al. | 438/401 |

\* cited by examiner

Primary Examiner—John F. Niebling
Assistant Examiner—Lynne A. Gurley
(74) Attorney, Agent, or Firm—Snell & Wilmer, L.L.P.

(57) ABSTRACT

A method for creating and preserving alignment marks used for aligning mask layers in integrated circuit formation including the steps of creating a first set of marks within a reference layer to form a basic alignment mark, creating a second set of marks overlapping the first set of marks and positioned perpendicular to the first set of marks in the same reference layer to form a preservation pattern, and etching the reference layer to form a substantially checkerboard-type pattern where portions of the first set of marks are recessed within a thickness of the reference layer. After creating the checkerboard-type pattern formed from the first and second marks, a first metal a layer may be deposited to fill in any recesses contained within the pattern. CMP follows without damaging the segmented portions of the first set of marks which lie recessed within a thickness of the reference layer. Finally, the preserved portions of the first set of marks are aligned with pattern marks for a second metal layer.

14 Claims, 5 Drawing Sheets

BASIC MARK @ LAYER-X

SA MARK @ C OR VIA 60

AFTER C OR VIA PROCESS

METHOD FOR CREATING AND PRESERVING ALIGNMENT MARKS FOR ALIGNING MASK LAYERS IN INTEGRATED CIRCUIT MANUFACTURE

BACKGROUND OF THE INVENTION

The present invention relates generally to a method for creating metal alignment marks in the manufacture of semiconductor integrated circuits. More particularly, the present invention relates to a method in which two layers of marks are positioned in perpendicular direction to one another in order to create alignment marks for properly aligning mask layers in the formation of integrated circuits where the alignment marks are preserved after chemical mechanical polishing processes utilized during the formation of an integrated circuit. The metal alignment mark creation of the present invention does not require removal of metals from the alignment marks in order to see the alignment marks for proper aligning of mask layers.

Microchip fabrication involves a series of processes such as layering, patterning and doping to create integrated circuits and semiconductor devices in and on a semiconductor wafer surface. As opposed to "non-integrated" circuits in which elements such as transistors, diodes, resistors, etc., are fabricated separately and then assembled, "integrated" circuits comprise elements which are fabricated and interconnected on a single chip of semiconductor material. In fabricating integrated circuits, thin layers of material such as insulators, semiconductors or conductors, are deposited on the surface of the semiconductor wafer by a variety of techniques including chemical vapor deposition, physical vapor deposition, evaporation and sputtering.

After the formation of a layer, a process known as patterning is performed in which the pattern in a reticle or photo mask is transferred to a wafer to identify areas to be doped or selectively removed from the layers. Patterning, also known as photomasking, requires two steps, namely (1) the positioning or alignment of the required image on the wafer surface and (2) the encoding of the image in the photoresist layer from an exposing light or other radiation source. The final wafer pattern is typically generated from several photomasks which are sequentially applied to the wafer. Accordingly, correct alignment of the image patterns and establishment of the precise image dimensions in the photoresist are absolute requirements for the proper functioning of the semiconductor devices in integrated circuits.

Aligner systems are composed of two major subsystems, one for correctly positioning the pattern on the wafer surface and the other for exposing the pattern on the wafer surface by directing radiation rays from the permanent exposure source to the wafer surface. Steppers involve stepping images directly from a reticle onto a wafer surface. A reticle is a reproduction of the pattern to be imaged on the wafer (or mask) by a step-and-repeat process where each chip is aligned and exposed, and the aligner steps to the next location. The actual size of the pattern on the reticle is usually several times the final size of the pattern on the wafer.

Advantages of using steppers and step-and-scan include the precise matching of largerdiameter wafers, improved resolution due to the smaller area being exposed at each time of exposure thereby lessening vulnerability to dust and dirt, and easier fabrication of oversized reticles so that the patterns to be imaged are easily and accurately produced. However, in order to facilitate production of semiconductor devices and integrated circuits using steppers and step-and-scan, automatic alignment systems are needed. Without automatic alignment, an operator would have to individually align several hundred die on a wafer at a productive rate, which is nearly impossible. Automatic alignment is accomplished by passing low-energy laser beams through alignment marks on the reticle and reflecting them off corresponding alignment marks on the wafer surface. Resulting signals arc analyzed and information is fed into a computer which moves the wafer around until the wafer and reticle are aligned. After alignment, the images are then placed in the photoresist by sequentially exposing each die pattern across and down the wafer.

This alignment of two features on successive layers is easily accomplished, especially in cases where the preceding layer is transparent or translucent, thereby allowing alignment marks formed within an underlying wafer to be optically detected so that the mask can be properly aligned through the transparent oxide layer for the contact and via holes. Nevertheless, there are many cases in which the alignment of non-successive layers is necessary where the intervening layer is opaque. Metal layer alignment is an example of such an instance where it may be necessary to align a mask to a mark on a layer that is covered with an opaque metal layer.

Further, alignment marks may be effected by subsequent processing of the pattern transferred to the wafer surface thereby rendering it more difficult to be observed for alignment. For example, a metallization layer, such as tungsten, for example, used for via interconnection, relies on the replication of a sharply-defined edge produced at the contact or via hole etching prior to the tungsten deposition. However, the conventional chemical mechanical planarization of the surface of the wafer that is performed during the conventional process of tungsten eliminates the sharply-defined edges of the alignment marks.

Other prior art processes have set forth methods for producing consistent alignment marks or recovering alignment marks during the formation of integrated circuits in semiconductor devices. For example, one known industry approach to eliminating the dishing impact on alignment marks is to remove the metal on top of the alignment marks using a "clear out window" approach. This "clear out window" process involves (1) coating, exposing and developing a "clear out window" to open the alignment mark area, (2) metal etching to remove the metal and resist strip, and (3) returning to the first step to coat, align, expose and develop the metal layer. The steps of coating, exposing and developing the "clear out window" to open the alignment mark area and metal etching to remove the metal and resist strip must occur for each metal layer that is processed. This results in increased costs and the need for additional equipment. The repeated steps required for the metal removal process impacts cycle time and results in an increase in costs of up to $27 or more per wafer per metal layer that is removed. Further, in order to carry out the metal removal process, additional equipment, such as stepper, etcher and resist strip tools, must be purchased to carry out the process.

Another known industry approach for preserving alignment marks is a shadow tab process which utilizes extended tabs during metal deposition to block out metal deposition on top of the alignment marks. Due to the use of extended tabs used in this process, metal shadowing causes die loss at the shadow tab sites and the dies located near the shadow tab sites. The greater the number of tabs used, the greater the number of die losses that are incurred. Typically, one can expect a loss of 4–12 dies per wafer when four tabs are used. In addition to the die loss problem, the shadow tab process also creates metal sticking problems in the metal deposition systems which require more frequent preventative maintenance during wafer processing. In addition, the die loss and increased preventative maintenance results in equipment downtime.

Other prior art has dealt with obtaining consistent alignment mark profiles and recovering alignment marks after chemical mechanical polishing. For example, U.S. Pat. No. 5,904,563, issued to Yu, discloses a method for metal alignment mark generation where the contact hole via mask used in the manufacture of semiconductor integrated circuits is modified to produce a plurality of lines and spaces adjacent to the edge of an alignment mark in the via hole pattern. The line-space pattern is etched simultaneously with the contact via holes and allows for the regeneration of the alignment mark after tungsten deposition and planarization of the wafer surface by conventional oxide etching and metallization steps.

Further, U.S. Pat. No. 5,926,720, issued Zhao et al., discloses a method and composition for obtaining consistent alignment mark profiles on semiconductor wafers using physical vapor deposition shadowing. The process includes physical vapor deposition of metal over an angled, metal-lined alignment mark trench in the wafer surface after chemical mechanical planarization of the wafer. Due to the shape of the trench, a minimal deposition is produced in the angled region of the trench which thereby overcomes asymmetrical metal loss due to attack from slurry accumulating in the trench during chemical mechanical planarization. As a result, a reliable and reproducible alignment mark is formed.

Finally, U.S. Pat. No. 5,858,588, issued to Chang et al, discloses a method for recovering alignment marks after chemical mechanical polishing. A prior art method for recovering alignment marks uses a first reticle having opaque squares surrounded by transparent windows to form a photoresist mask over the alignment marks so that the alignment marks can be recovered, and a second reticle having transparent windows for removing inter-level dielectric from the alignment region. The Chang et al. method divides the pattern conventionally placed on separate reticles into two parts and places the two parts in the end regions of the mask used to pattern the active region of the wafer. Accordingly, the pattern formed in the end regions of the mask used to pattern an integrated circuit wafer can be used to recover the alignment marks after inter-level dielectric formation, inter-level dielectric planarization, and formation of a metal layer without the use of separate reticles.

Unfortunately, neither the metal alignment mark generation in Yu nor the alignment mark recovery in Chang et al. address the problems with non-visible alignment marks, non-symmetrical alignment marks, and damaged alignment marks which can result from planarization using chemical mechanical polishing. In addition, although the method and composition for obtaining consistent alignment mark profiles disclosed in Zhao el al. address alignment mark defects resulting from chemical mechanical polishing, the method disclosed in Zhao et al. requires the formation of angled trenches which must be accurately constructed in order to provide the desired shadowing effect for minimal deposition in the angled region of the trench so that reliable and reproducible alignment marks can be created.

Accordingly, there is a need for an efficient and accurate method for creating and preserving alignment marks for properly aligning mask layers in the manufacture of integrated circuits which does not result in significant increases in cost, equipment, time and personnel. There is also a need for an efficient and accurate method for creating and preserving alignment marks that can be applied to any tool mark design.

BRIEF SUMMARY OF THE INVENTION

A principal object of the present invention is to provide a method for creating and preserving alignment marks in the manufacture of semiconductor integrated circuits.

Another object of the present invention is to provide a method for aligning mask layers, in particular metal layers, in the formation of integrated circuits on semiconductor wafers which does not result in a significant increase in process steps for forming the integrated circuits.

It is still another object of the present invention to provide a method for producing and preserving alignment marks for forming integrated circuits which does not result in added wafer cost or loss in throughput and cycle time.

It is yet another object of the present invention to provide a method for creating and preserving alignment marks used for aligning mask layers in the formation of integrated circuits on semiconductor wafers where alignment accuracy meets equipment specifications and where the method for creating and preserving the alignment marks can be applied to any existing tool mark design.

The above and other aspects of the present invention may be carried out in one form by a method for creating and preserving alignment marks used for aligning mask layers in integrated circuit formation comprising the steps of creating a first set of marks within a reference layer, such as silicon dioxide or silicon, for example, to form a basic alignment mark, creating another set of marks in the same reference layer wherein the second set of marks overlaps the first set of marks in a substantially perpendicular arrangement with respect to the first set of marks, and etching the reference layer such that a checkerboard-type pattern is formed by the first and second set of marks wherein portions of the first set of marks remain recessed within a thickness of the reference layer. The material for the first and second set of marks can be silicon, silicon dioxide, TEOS, epi-silicon, poly-silicon or metals which include aluminum, aluminum alloys, copper, tungsten and gold. Once the checkerboard-type pattern is created by the first and second set of marks, a first predetermined layer can be deposited over the reference layer to fill in any open recesses contained within the checkerboard-type pattern. The first predetermined layer currently comprising the top surface of the semiconductor wafer is then planarized by chemical mechanical polishing. After chemical mechanical polishing of the first predetermined layer, segments of the underlying basic alignment mark remain preserved for use in alignment due to their recessed position within a thickness of the reference layer.

The objectives, features and advantages of the present invention will become more apparent to those skilled in the art from the following more detailed description of the preferred embodiment of the invention made in conjunction with the accompanying drawings.

DETAILED DESCRIPTION OF THE PREFERRED EMBODIMENT

The present invention may be described herein in terms of various processing steps. It should be appreciated by those skilled in the art that such processing steps may be realized by any number and combination of various conventional techniques and equipment for carrying out those techniques. It should also be appreciated that the particular implementations and process steps shown and described herein are illustrative of the invention and its best mode, and are not intended to otherwise limit the scope of the present invention in any way.

Figure 1A:
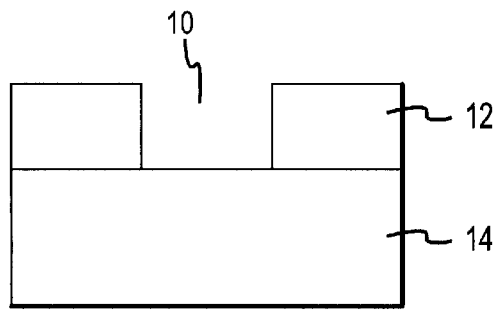
FIGS. 1A–1E show partial cross-sectional views of a semiconductor wafer in various stages during prior art creation of a topographical alignment mark used with conventional chemical mechanical polishing processing.
Figure 1B:
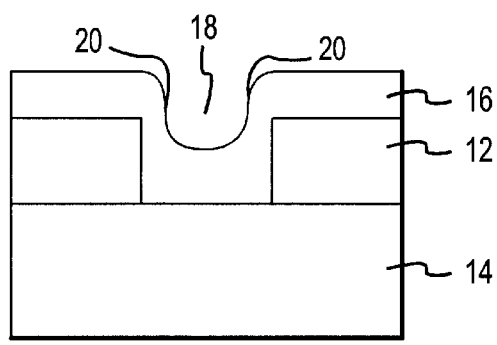

FIGS. 1A–1E refer to various stages in the prior art creation of an alignment mark used with conventional chemical mechanical processing (CMP). For example, as illustrated in FIG. 1A, a trench 10 is etched in a dielectric layer 12 which has been deposited on the surface of a wafer substrate 14, such as silicon. The trench 10 serves as a mold for an alignment mark. In FIG. 1B, a first metal layer 16, such as tungsten, for example, is conformably deposited over the surface of the wafer by chemical vapor deposition (CVD). The CVD metal layer is conformal and forms a deposition trench 18 following the contours of the mold trench 10 with the walls 20 of the deposit trench 18 being formed of the metal layer 16.

Figure 1C:
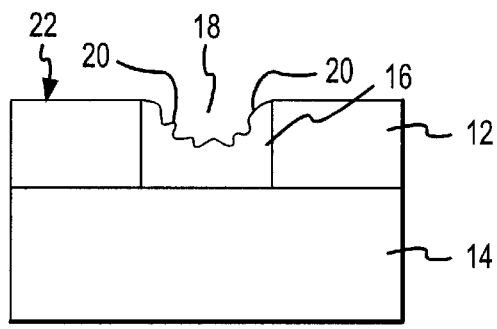

FIG. 1C shows the wafer surface 22 after planarization by chemical mechanical polishing. Such polishing is well-known in the art and generally includes attaching one side of the wafer to a flat surface of a wafer carrier chuck and pressing the other side of the wafer against a flat polishing surface. In general, the polishing surface comprises a polishing pad that has an exposed abrasive surface of, for example, cerium oxide, aluminum oxide, fumed/precipitated silica or other particulate abrasives. During the polishing or planarization process, the workpiece (e.g., wafer) is typically pressed against the polishing pad surface while the pad rotates about its vertical axis. Preferably, to maximize polishing, an abrasive slurry is introduced between the pad and substrate. Various types of well-known abrasive slurries can be used. During CMP, slurry accumulates in the deposition trench 18. Accordingly, the walls 20 of the trench 18 are attacked by the oxidizing slurry since the polishing pad does not contact the deposition trench walls 20 to polish them or remove the slurry. As a result, the walls 20 are rendered uneven in an unpredictable way by the CMP slurry attack and the profile of the deposition trench 18 following CMP may be asymmetric and non-reproducible as shown in FIG. 1C.

Figure 1D:
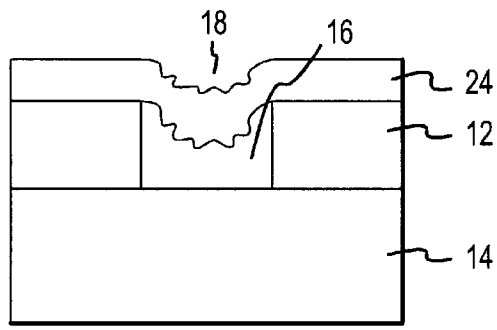
Figure 1E:
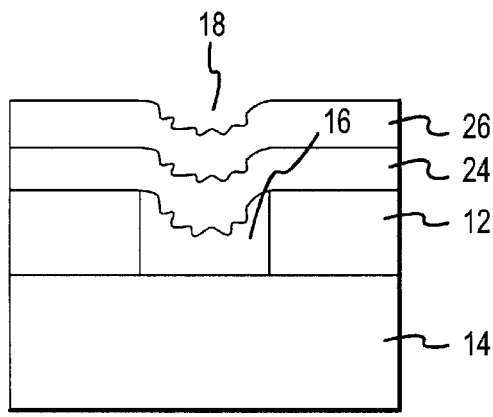

The asymmetries in the deposition trench 18 results in an asymmetric and non-reproducible wafer surface topography following metal deposition of a second metal layer 24 and a photoresist 26 which are shown in FIGS. 1D and 1E, respectively. Accordingly, although the deposition trench alignment mark 18 may be detectable, the ability to use the deposition trench alignment mark 18 for proper alignment will be compromised due to its deformations caused by the CMP slurry.

Figure 2A:
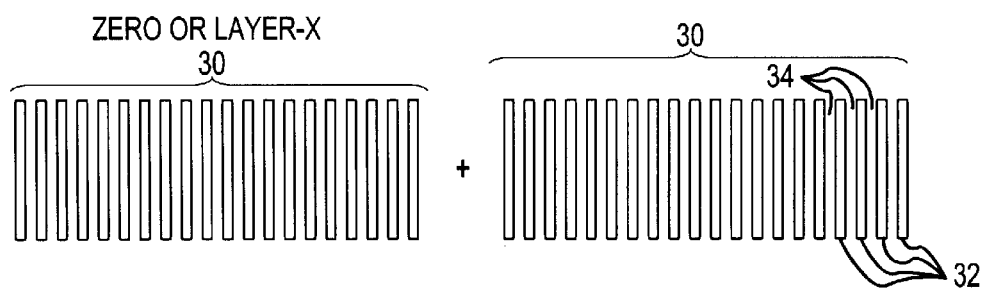
FIGS. 2A–2C show top plan views of a portion of a semiconductor wafer during various stages in the method of the present invention for creating an alignment mark used for aligning mask layers in the formation of integrated circuits wherein the created alignment mark is preserved post-chemical mechanical polishing.
Figure 2B:
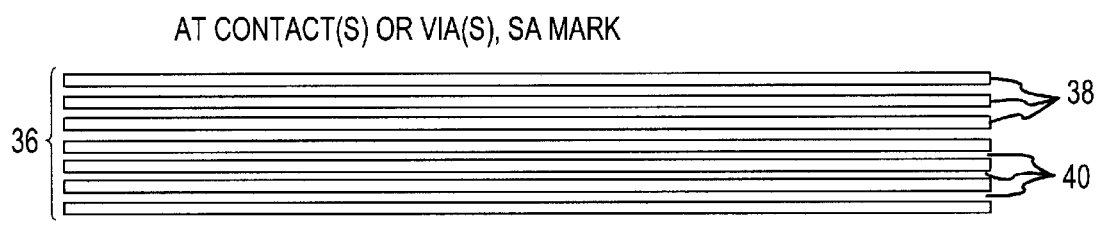
Figure 2C:
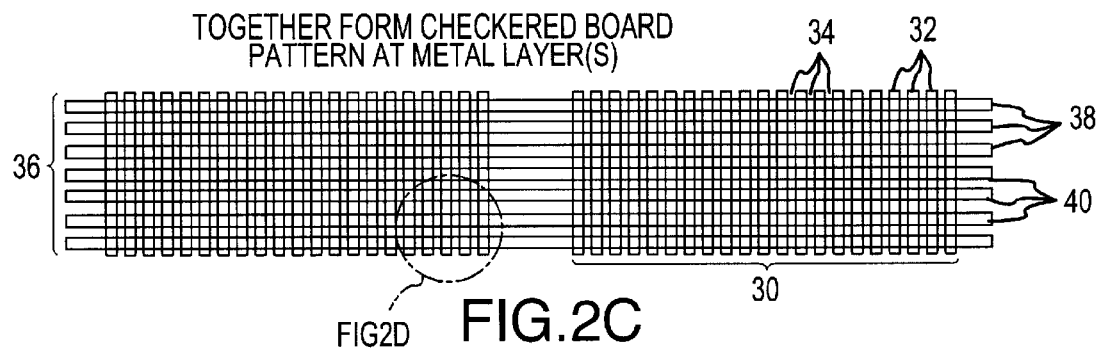
Figure 2D:
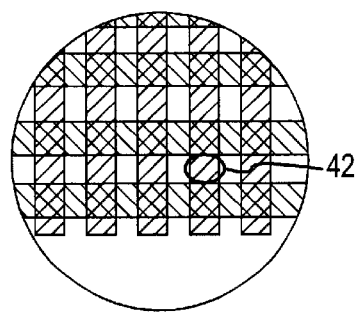
FIG. 2D is a magnified view of area 2D shown in FIG. 2C.

Turning now to FIGS. 2A–2C, there is shown a series of top plan views illustrating various stages in the creation of a topographical alignment mark for use with CMP processing in accordance with the method of the present invention. The method of the present invention comprises a multilayer alignment mark design which protects the alignment mark from CMP damage. FIG. 2A shows a top plan view of a first set of marks 30, known as the basic alignment mark, which are etched into a dielectric layer or oxide layer deposited on the wafer substrate. The dielectric or oxide layer may be comprised of silicon dioxide or silicon. The first set of marks 30, or basic alignment mark, is made at the zero layer or the layer immediately preceding the contact or via. The first set of marks 30 comprises a plurality of alternating lines 32 and spaces 34.

FIG. 2B shows a top plan view of a second set of marks 36, or preservation pattern, which is etched into the same dielectric or oxide layer as the first set of marks 30. The second set of marks 36, or preservation pattern, is positioned above, or overlaps, the first set of marks 30 and is arranged in a direction which is substantially perpendicular to the first set of marks 30. Like the first set of marks 30, the second set of marks 36 comprises a plurality of alternating lines 38 and spaces 40.

The second set of marks 36 is formed at each contact or via layer and may be made by a drop-in method, or alternatively may be designed in the mask for the checkerboard pattern which results from the first set of marks 30 and the second set of marks 36. The marks are etched during contact or via etch and, once etched, the basic alignment mark 30 and preservation pattern 36 together form a checkerboard pattern as shown in FIG. 2C. After etching the dielectric or oxide layer which contains the marks, the surface of the wafer is planarized using chemical mechanical polishing. Since segmented portions of the first set of marks 30, or the basic alignment mark, are recessed by the thickness of the dielectric or oxide layer, the polishing pad cannot damage the recessed segments of the first set of marks 30 during chemical mechanical polishing. As a result, the segmented portions of the first set of marks 30, or basic alignment mark, remain preserved for later alignment with a metal layer. Area 42 shows a segmented area of the basic alignment mark 30 which is recessed by the thickness of the dielectric or oxide layer, thereby preserving that portion of the basic alignment mark 30.

Figure 3A:
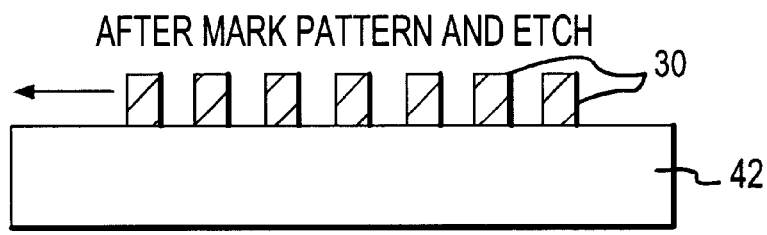
FIG. 3A depicts a cross-sectional view of a portion of a semiconductor wafer after etching a first set of marks in the dielectric or oxide layer in accordance with the method of the present invention for creating and preserving alignment marks.
Figure 3B:
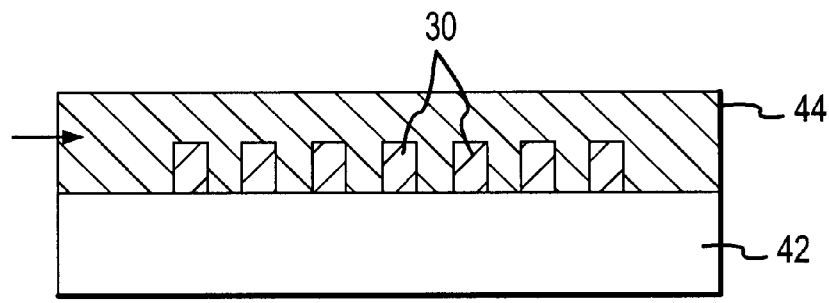
FIG. 3B depicts a cross-sectional view of a portion of a semiconductor wafer after etching a second set of marks overlapping and perpendicular to the first set of marks.
Figure 3C:
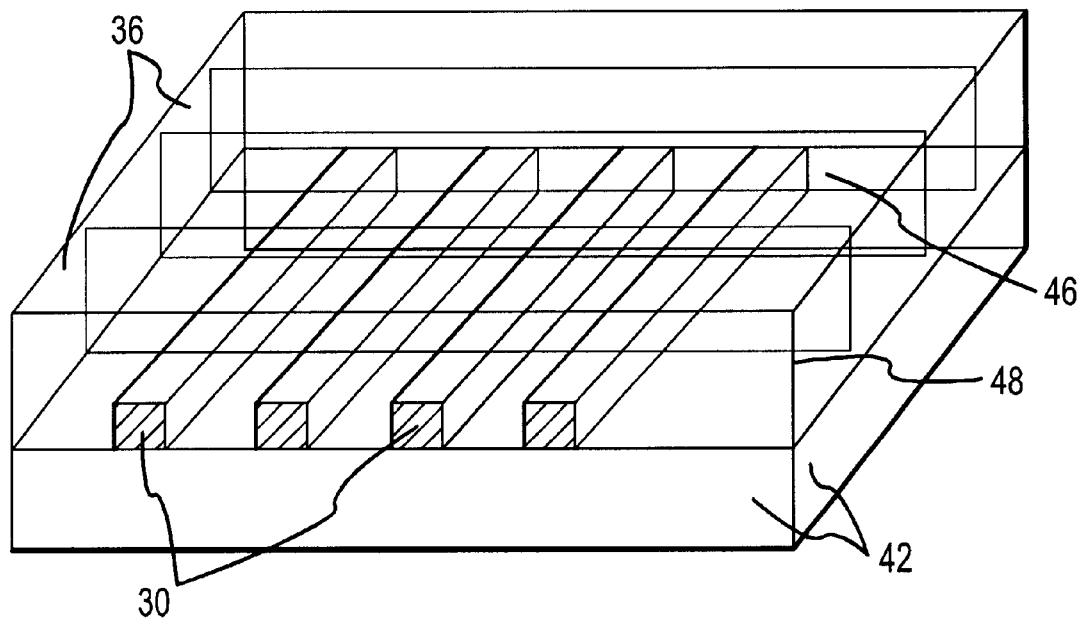
FIG. 3C illustrates a perspective view of a portion of a semiconductor wafer after creation of the first and second set of marks and after contact or via photoresist and etch in accordance with the method of the present invention.

FIGS. 3A–3C show cross-sectional views of a portion of a semiconductor wafer during various stages in the method of the present invention for creating and preserving alignment marks used with conventional CMP methods. FIG. 3A shows the first set of marks 30 which have been etched into a dielectric or oxide layer deposited on the wafer substrate 42. In FIG. 3B, the second set of marks (not shown) are etched into the contact or via dielectric or oxide layer 44 such that they overlap, and are situated substantially perpendicular to, the first set of marks 30. Finally, FIG. 3C shows a perspective view of the checkerboard pattern which is created after etching the dielectric or oxide layer in which the first and second sets of marks 30, 36 are contained. Arrow 46 points to an area in the checkerboard pattern of the first and second sets of marks 30, 36 where the contact or via dielectric or oxide layer has been etched away. In contrast, arrow 48 points to where the contact or via dielectric or oxide layer remains, thereby preserving segmented portions of the first set of marks 30, or basic alignment mark, which remain recessed within the contact or via dielectric or oxide layer.

Figure 4A:
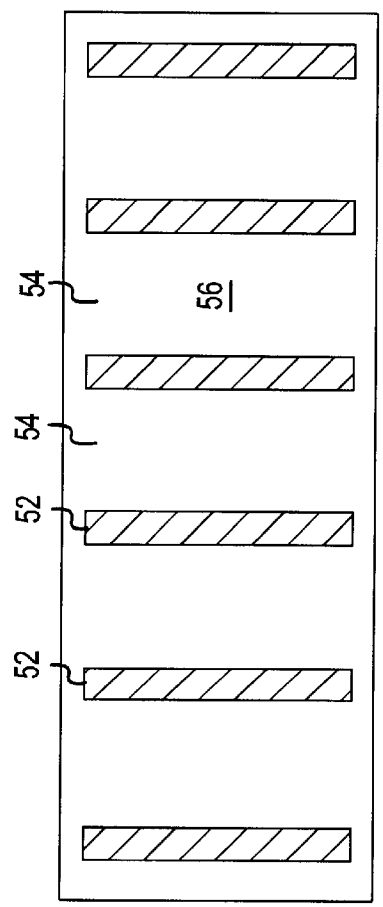
FIGS. 4A–4C depict top plan views of a portion of a semiconductor wafer showing the various stages in the creation of alignment marks associated with one via in accordance with the method of the present invention.
Figure 4B:
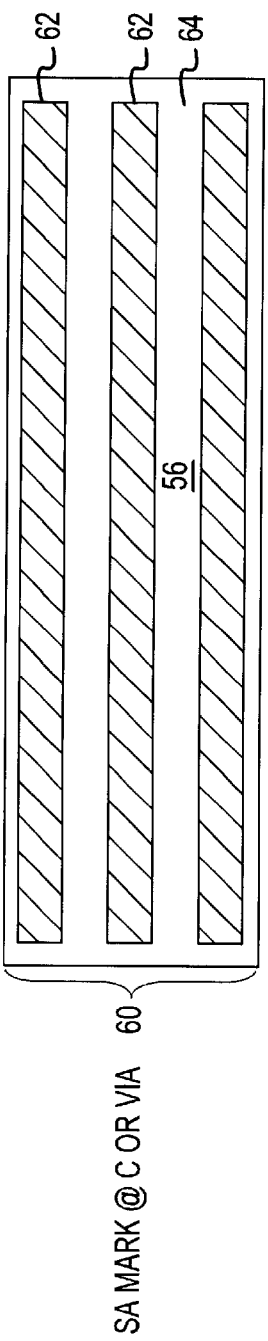
Figure 4C:
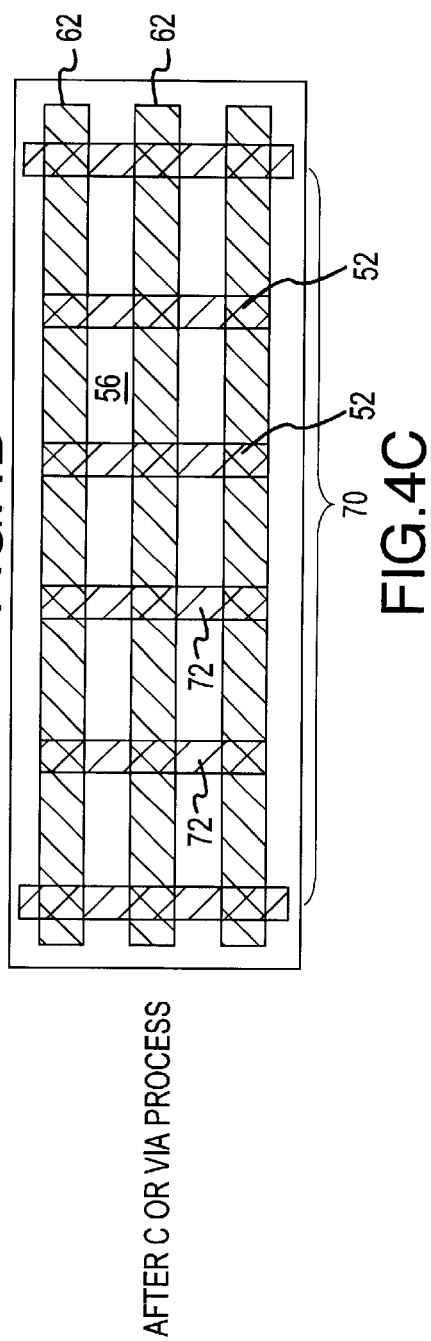

A top plan view of a portion of a semiconductor wafer showing various stages in the creation of alignment marks for a single contact or via are shown in FIGS. 4A–4C. FIG. 4A shows a first set of marks 50, or basic alignment mark, which comprises a plurality of alternating lines 52 and spaces 54. The first set of marks 50, like the second set of marks 60, shown in FIG. 4B, are etched in a dielectric layer or oxide layer 56 which is deposited on a wafer substrate. The second set of marks 60 also comprises a plurality of alternating lines 62 and spaces 64, which are positioned such that they overlap the first set of marks 50 in a substantially perpendicular fashion. Finally, after contact or via photoresist and etching of the dielectric or oxide layer 56, a checkerboard pattern is formed from the first and second set of marks 50, 60 as shown in FIG. 4C. Reference numeral 70 shows that area which comprises the contact or via, while the areas indicated with reference numeral 72 show those areas where segments of the first set of marks 50, or basic alignment mark, were preserved post-CMP as a result of being recessed by a thickness of the oxide layer.

Figure 5:
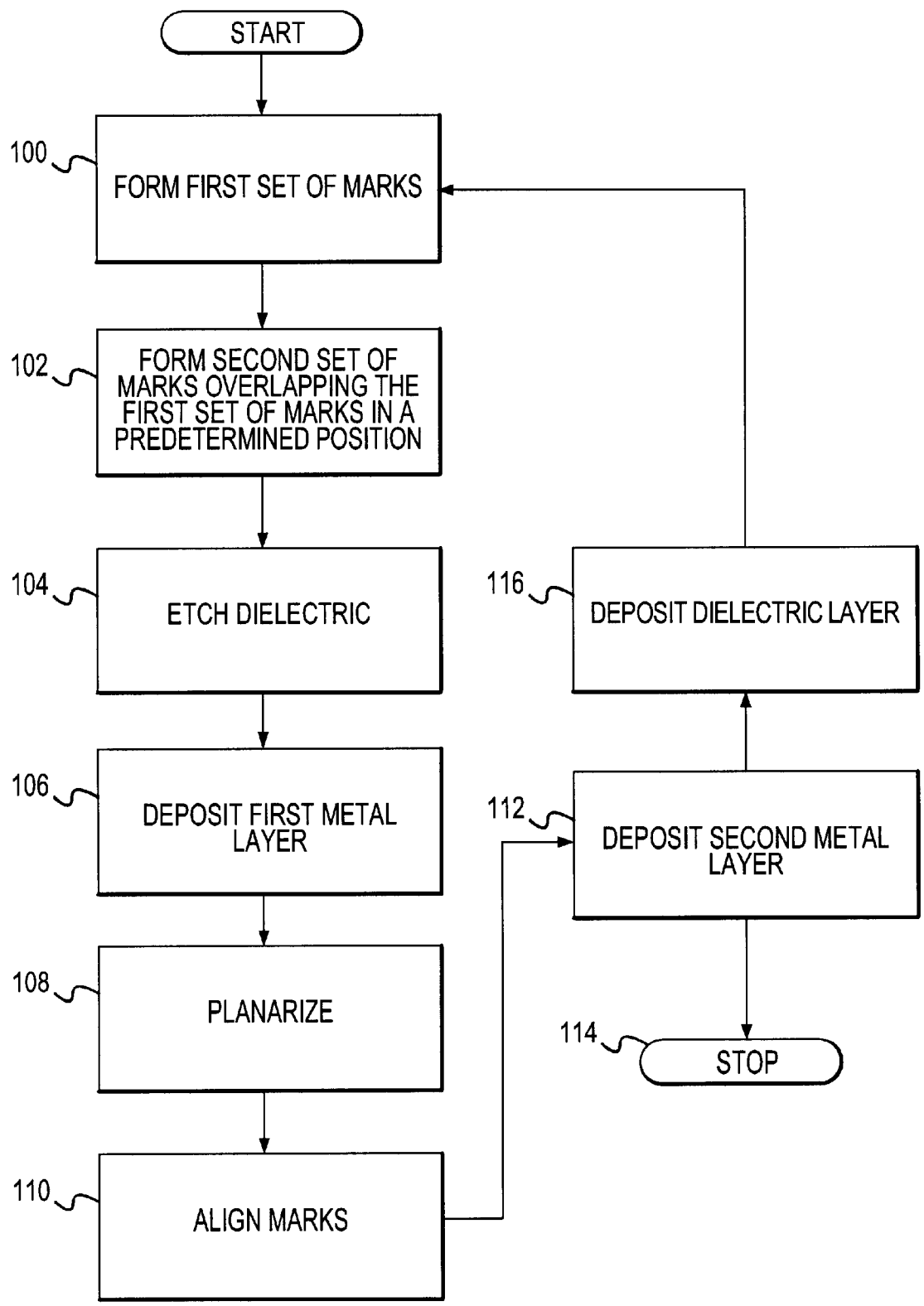
FIG. 5 depicts a flow chart showing the method steps of the present invention for creating and preserving alignment marks and using those alignment marks for aligning mask layers in the formation of integrated circuits on semiconductor wafers.

A flow chart depicting the method of the present invention for aligning mask layers in the formation of integrated circuits on semiconductor wafers is shown in FIG. 5. In accordance with the preferred embodiment of the present invention, a first set of marks is formed within a dielectric layer 100 which has been deposited on a wafer surface. In step 102, a second set of marks is formed within the dielectric layer such that they overlap the first set of marks in a predetermined position with respect to the first set of marks. The example used throughout the description of the preferred embodiment of the invention has identified the predetermined position of the second set of marks as being perpendicular to the first set of marks. However, it should be understood by those skilled in the art that any predetermined directional arrangement may be utilized as long as an adequate portion of the underlying first set of marks can be preserved for alignment. The dielectric or oxide layer in which the first and second sets of marks are formed preferably comprises silicon dioxide or silicon. The first set of marks (basic marks) can also be made with metals at metal layer steps.

In step 104, the dielectric or oxide layer is etched such that the first and second set of marks together form a checkerboard-type pattern wherein segmented portions of the first set of marks, or basic alignment mark, are preserved as a result of being recessed by a thickness of the dielectric or oxide layer. A first metal layer is deposited over the checkerboard-type pattern in step 106 whereby the first metal layer fills in any open recesses contained within the checkerboard-type pattern formed from the first and second sets of marks. The first metal layer is preferably comprised of tungsten, copper, aluminum, aluminum alloys, or gold. Next, in step 108, the surface of the wafer, which now comprises the first metal layer, is planarized using chemical mechanical polishing or any other conventional planarization technique such as an etch back process. Due to the fact that certain segmented portions of the first set of marks are recessed within a thickness of the dielectric or oxide layer, the polishing pad cannot damage these recessed portions of the basic alignment mark during chemical mechanical polishing. As a result, these segmented portions of the basic alignment mark are preserved for later alignment with a metal layer.

Finally, in step 110, the preserved segmented portions of the basic alignment mark are aligned with a pattern for a second metal layer, and the second metal layer is deposited on the surface of the wafer in step 112. The second metal layer is preferably comprised of aluminum, an aluminum silicon alloy, an aluminum copper alloy, an aluminum titanium alloy, or copper. These process steps comprising the method of the present invention can then be repeated depending upon the number of mask layers which must be properly aligned by depositing another dielectric layer, as in step 116, so that additional sets of first and second marks can be formed. For the most part, the alignment of these mask layers will involve the alignment of metal layers in the formation of integrated circuits on semiconductor wafers.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A method for aligning mask layers in the formation of integrated circuits on semiconductor wafers comprising the steps of:
   a) forming at least one first mark in a reference layer;
   b) forming at least one second mark in said reference layer at a position substantially perpendicular to said first mark and overlapping said first mark;
   c) etching said reference layer to create a checkerboard-type pattern from said first and second marks;
   d) depositing a first predetermined layer over said reference layer to fill in any open recessed portions contained within said checkerboard-type pattern;
   e) planarizing said first predetermined layer; and
   f) depositing a second predetermined layer over said reference layer and said first predetermined layer by aligning recessed portions of said first mark located within said reference layer with at least one alignment mark in a predetermined pattern.

2. The method of claim 1 wherein said step of forming at least one first mark comprises the step of forming a first set of marks.

3. The method of claim 2 wherein said step of forming at least one second mark comprises the step of forming a second set of marks such that said second set of marks lies substantially perpendicular to said first set of marks.

4. The method of claim 1 wherein said step of forming at least one second mark comprises the step of blading said second mark within said reference layer using at least one of a stepper and a step-and-scan.

5. The method of claim 1 wherein said step of forming at least one second mark comprises the step of forming said second mark by designing said second mark in a mask for transferring said substantially checkerboard-type pattern to a wafer surface.

6. The method of claim 1 wherein said mask layers are metal layers and said steps for depositing first and second predetermined layers comprise steps for depositing first and second metal layers.

7. The method of claim 6 wherein said step of depositing a first metal layer comprises the step of depositing at least one of a tungsten layer, a copper layer, an aluminum layer, an aluminum alloy layer, and a gold layer.

8. The method of claim 6 wherein said step of depositing a second metal layer comprises the step of depositing at least one of an aluminum layer, an aluminum silicon alloy layer, an aluminum copper alloy layer, an aluminum titanium alloy layer, and a copper layer.

9. The method of claim 1 wherein said step of forming at least one second mark comprises the step of forming said at least one second mark in said reference layer at a position for at least one of a contact and a via.

10. The method of claim 1 wherein said step of planarizing said first predetermined layer comprises the step of chemical mechanical polishing said first predetermined layer.

11. A method for creating and preserving alignment marks used for aligning mask layers in the formation of integrated circuits on semiconductor wafers comprising the steps of:
 a) creating a plurality of alternating parallel lines and spaces in a reference layer to form a basic alignment mark;
 b) creating another plurality of alternating lines and spaces in said reference layer to form a preservation pattern in any layer which functions as a contact layer wherein the preservation pattern is overlapping said basic alignment mark and positioned in a substantially perpendicular direction to said basic alignment mark; and
 c) etching said preservation pattern at each contact layer to form a substantially checkerboard pattern with said basic alignment mark such that portions of said basic alignment mark are recessed within said reference layer.

12. The method of claim 11 wherein said step of creating a preservation pattern comprises the step of blading said preservation pattern within said reference layer using at least one of a stepper and a step-and-scan.

13. The method of claim 11 wherein said step of creating a preservation pattern comprises the step of forming said preservation pattern by designing said preservation pattern in a mask for transferring said substantially checkerboard-type pattern to a wafer surface.

14. A method for creating and preserving alignment marks for proper alignment of mask layers in integrated circuit manufacture comprising:
 a) forming a first set of marks from at least one of a contact and via formed within an oxide layer deposited on a substrate;
 b) forming a second set of marks in said oxide layer at said at least one of a contact and via wherein said second set of marks a plurality of lines and spaces overlapping said first set of marks in a substantially perpendicular direction;
 c) etching said oxide layer such that said first and second sets of marks together form a checkerboard-type pattern such that segments of said first set of marks remain recessed within said oxide layer;
 d) depositing a first metal layer over said oxide layer thereby filling any open recesses contained within said checkerboard-type pattern;
 e) planarizing said first metal layer;
 f) aligning said recessed segments of said first set of marks with corresponding alignment marks; and
 g) depositing a second metal layer over said first metal layer and said oxide layer.

* * * * *